United States Patent [19]

Sato et al.

[11] 4,267,563
[45] May 12, 1981

[54] CHANNEL SELECTING APPARATUS FOR USE WITH SIGNAL RECEIVER AND SIGNAL RECORDER

[75] Inventors: Masaru Sato, Asaka; Toshio Amano, Tokyo, both of Japan

[73] Assignee: Sony Corporation, Tokyo, Japan

[21] Appl. No.: 971,553

[22] Filed: Dec. 20, 1978

[30] Foreign Application Priority Data

Dec. 21, 1977 [JP] Japan .................. 52-154066
Dec. 24, 1977 [JP] Japan .................. 52-155887

[51] Int. Cl.³ ........................................... H04N 5/78
[52] U.S. Cl. ........................... 358/127; 369/7; 358/191.1
[58] Field of Search .............. 358/127, 188, 191, 192, 358/192.2, 191.1; 179/100.11, 100.1 PS; 360/33; 325/395, 396

[56] References Cited

U.S. PATENT DOCUMENTS

| | | | |
|---|---|---|---|
| 3,829,891 | 8/1974 | Uchida | 360/33 |
| 4,015,090 | 3/1977 | Kitada | 179/100.1 PS |
| 4,031,548 | 6/1977 | Kato et al. | 358/188 |
| 4,081,754 | 3/1978 | Jackson | 325/396 |
| 4,167,704 | 9/1979 | Sato et al. | 360/33 X |
| 4,182,991 | 1/1980 | Amano | 360/33 X |

Primary Examiner—James W. Moffitt
Assistant Examiner—Donald McElheny, Jr.
Attorney, Agent, or Firm—Lewis H. Eslinger; Alvin Sinderbrand

[57] ABSTRACT

Channel selecting apparatus for use with a signal receiver coupled to a first tuning device and a signal recorder coupled to a second tuning device is operable to tune the first and second tuning devices to preselected channels for receiving broadcast frequencies. In one embodiment, the signal receiver is a television receiver including a video display, and the signal recorder is a video tape recorder (VTR). Selectively operable channel selectors, common to the first and second tuning devices supply channel selector signals to determine the tuning condition of both tuning devices. When the VTR is actuated, a locking circuit locks the second tuning device to the tuning condition determined immediately prior to such actuation regardless of a subsequent difference in the channel selector signals. The locking circuit in the absence of the actuation of the VTR, enables the tuning condition of the second tuning device, as well as that of the first tuning device, to be determined by the channel selector signals. A switching circuit has first and second inputs coupled to the first and second tuning devices, respectively, to receive the channels to which the first and second tuning devices are tuned, and an output coupled to the television receiver. The switching circuit, when the VTR is unactuated, connects the output of the switching circuit to the second input thereof. When the VTR is actuated, the switching circuit connects the output thereof to its first input.

12 Claims, 3 Drawing Figures

FIG.1

CHANNEL SELECTING APPARATUS FOR USE WITH SIGNAL RECEIVER AND SIGNAL RECORDER

BACKGROUND OF THE INVENTION

This invention relates to channel selecting apparatus for use with a signal receiver which is coupled to a first tuning device and with a signal recorder which is coupled to a second tuning device such that the information contained in the channel to which the first tuning device is tuned is received by the signal receiver and the information which is contained in the channel to which the second tuning device is tuned is recorded by the signal recorder, and more particularly, to channel selecting apparatus of the aformentioned nature wherein the information which is supplied by the second tuning device to the signal recorder also is supplied to the signal receiver.

In the field of signal receiving and recording, it often is desirable to record signal information which is included in one channel, such as signal information which is transmitted on one broadcast frequency, while receiving or monitoring signal information which is included in a different channel. For example, in television receiving and recording applications, it may be desirable to record on a video recorder, such as a video tape recorder (VTR), video signals which are included in one channel while displaying on a television receiver, or monitor, a video picture which is contained in a different channel. In general, this is achieved by providing separate tuning devices. Typically, the VTR is provided with one tuning device while the television receiver is provided with another tuning device, both of these tuning devices being operated independently of each other so as to receive different channels, or broadcast frequencies. Accordingly, the user may view one television program while recording a different television program.

In early embodiments of signal receivers and recorders, the respective, independent tuning devices provided therein included electromechanical tuners. More recently, it has been found that electronic tuners provide a distinct advantage over the earlier electromechanical devices. In general, an electronic tuner includes a variable reactance device, such as a varactor, or varicap diode, whose reactance is determined by a control voltage applied thereto. Such electronic tuners do not use turret-type tuning capacitors having mechanical detents, or stops, intrinsic to prior art electromechanical tuners. Consequently, the electronic tuners do not suffer from oxidized or worn contacts, difficult operation and relatively short life associated with electromechanical tuners. When such electronic tuners are used in television receivers and recorders, separate selector switches, such as pushbutton switches, may be provided in the television receiver and in the VTR. This duplication of parts results in an additional expense. However, it has been thought that such separate sets of selector switches were necessary in order to insure that the respective tuning conditions of the television receiver and the VTR could be established independently of each other. However, it has been found that two electronic tuners can be controlled substantially independently of each other so as to permit the viewing and recording of different channel information, while providing only a single set of selector switches. This is particularly advantageous when the television receiver and VTR are contained within the same housing or cabinet. One example of such channel selecting apparatus wherein a single set of selector switches is used to control the tuning conditions of two separate electrically tunable tuning devices is disclosed in copending application Ser. No. 912,080, assigned to the assignee of the present invention.

In the channel selecting apparatus of the type disclosed in the aforementioned copending application, selective operation of the single set of channel selector switches simultaneously determines the tuning conditions of the tuning devices in both the television receiver and in the VTR. Hence, both tuning devices generally are tuned to the same channel, depending upon which selector switch has been operated. However, when a recording operation is to be carried out, a recording switch is closed which locks the tuning device included in the VTR to the channel to which that tuning device had been tuned immediately prior to the initiation of the recording operation. Then, different channel selector switches can be operated so as to tune the television receiver to any different desired channel; while the tuning condition of the VTR is locked. This prevents undesired interruption in the channel information which is being recorded, yet permits the user to view any other desired program.

In the channel selecting apparatus of the type disclosed in the aforementioned application, as well as in other channel selecting apparatus which have been proposed heretofore, the output of the tuning device included in the television receiver is supplied only to the receiver signal processing circuitry, and the output of the tuning device included in the VTR is supplied only to the recorder processing circuitry. Although the video information which is being recorded can be monitored by tuning the television receiver to the same channel as that which is being recorded, the operability of the VTR tuning device is not known until after the video signals have been recorded and then subsequently reproduced. Hence, if the VTR tuning device is not tuned accurately, or if there is a malfunction therein, such possibilities will not be known until after the recording operation is completed. This may result in the recording of degraded video signals, which degradation could have been corrected if the video signals derived at the output of the VTR tuning device had been monitored prior to recording.

OBJECTS OF THE INVENTION

Therefore, it is an object of the present invention to provide improved channel selecting apparatus which overcomes the problems noted hereinabove attending prior art apparatus.

Another object of this invention is to provide improved channel selecting apparatus for use in determining the tuning conditions of separate tuning devices which are used with a signal receiver and a signal recorder, respectively.

Another object of this invention is to provide improved channel selecting apparatus which can be used with the tuning device of a television receiver and with the tuning device of a VTR, wherein the tuning condition of the VTR can be monitored so as to insure the recording of accurate video signals.

An additional object of this invention is to provide separate tuning devices for a signal receiver and a signal recorder, respectively, wherein, during a recording operation, the tuning condition of the tuning device associated with the signal receiver can be changed, as desired, while the tuning condition of the tuning device associated with the signal recorder remains fixed; and wherein prior to the recording operation, the tuning condition of the tuning device associated with the signal recorder can be monitored.

Various other objects, advantages and features of the present invention will become readily apparent from the ensuing detailed description, and the novel features will be particularly pointed out in the appended claims.

SUMMARY OF THE INVENTION

In accordance with this invention, channel selecting apparatus is provided for use with a signal receiver, such as a television receiver, and a signal recorder, such as a video recorder, the receiver and recorder being coupled to first and second tuning devices, respectively. Selectively operable channel selectors are common to the first and second tuning devices and are operated to generate and supply channel selector signals to the tuning devices so as to determine the tuning conditions of both devices. A locking circuit operates in response to the actuation of the signal recorder to lock the second tuning device to the tuning condition which had been determined immediately prior to the actuation of the signal recorder, regardless of the subsequent generation of different channel selector signals by the channel selector. The locking circuit operates in response to the non-actuation of the signal recorder to enable the tuning condition of the second tuning device to be determined by the channel selector signals generated by the channel selectors simultaneously with the determination of the tuning condition of the first tuning device. A switching circuit has first and second inputs coupled to the first and second tuning devices, respectively, to receive the channels to which the first and second tuning devices are tuned, and an output is coupled to the signal receiver. The switching circuit is operative when the signal recorder is not actuated to connect the output thereof to its second input; and the switching circuit is operative when the signal recorder is actuated to connect the output thereof to its first input. The broadcast frequency received by the second tuning device is supplied to the signal receiver when the signal recorder is not actuated and the broadcast frequency which is received by the first tuning device is supplied to the signal receiver when the signal recorder is actuated.

Thus, in accordance with one aspect of this invention, when the channel selecting apparatus is used with a television receiver and a video recorder, the tuning condition of the tuning device included in the recorder is monitored by the television receiver prior to the initiation of a recording operation. Thus, the user can ascertain whether the tuning device included in the recorder is functioning properly so that an accurate video signal will be recorded. During the recording operation, the tuning device included in the television receiver can be tuned to any desired channel, while the tuning device included in the video recorder remains fixed to the channel being recorded.

BRIEF DESCRIPTION OF THE DRAWINGS

The following detailed description, given by way of example, will best be understood in conjunction with the accompanying drawings in which.

DETAILED DESCRIPTION OF CERTAIN PREFERRED EMBODIMENTS

Figure 1:
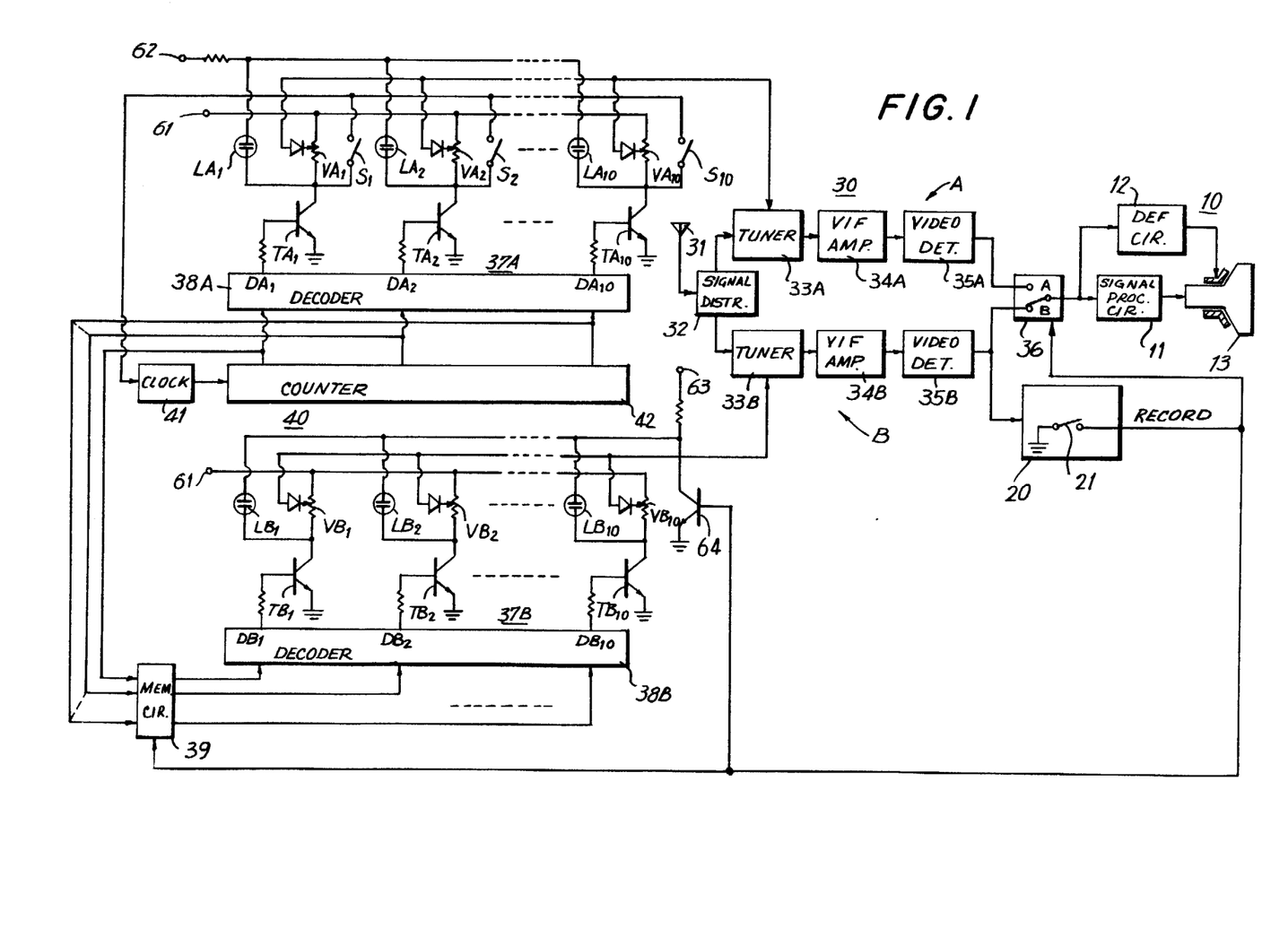
FIG. 1 is a partial block, partial schematic diagram of one embodiment of the present invention.

Referring now to the drawings, wherein like reference numerals are used throughout, and in particular to FIG. 1, there is illustrated one embodiment of channel selecting apparatus which can be used with a signal receiver and a signal recorder. For the purpose of the present discussion, it will be assumed that the signal receiver is a television receiver 10 including a video display, such as a cathode ray tube 13; and that the signal recorder is a video recorder 20, such as a video tape recorder (VTR). It will be appreciated that, if desired, other signal receiving and signal recording devices can be used, such as audio receiving and recording devices. Furthermore, the present invention need not be restricted solely to receiving and recording devices. Both devices can be signal receivers, or both devices can be signal recorders. For the embodiment wherein the signal receiver is television receiver 10, this television receiver includes signal processing circuits 11 and deflecting circuits 12, as are conventional. For the application wherein signal recorder 20 is a VTR, this VTR includes conventional signal processing circuits, whereby a received video signal is suitably recorded. VTR 20 includes a RECORD switch 21 which, when actuated, initiates a recording operation and, moreover, produces a RECORD signal at the output of the VTR.

The illustrated apparatus includes tuning circuitry 30, channel selecting circuitry 40 and a change-over switch 36. For convenience, all circuits which are associated with television receiver 10 are identified with reference letter A, and all circuits which are associated with VTR 20 are identified with reference letter B. Tuning circuitry 30 includes a tuning device A and a tuning device B. More particularly, tuning device A includes an electronic tuner stage 33A, a video IF (VIF) amplifier 34A and a video detector 35A, all connected in cascade as illustrated. Similarly, tuning device B includes an electronic tuner stage 33B, a VIF amplifier 34B and a video detector 35B, all connected in cascade. The respective electronic tuner stage, VIF amplifier and video detector are of conventional construction and, therefore, further description thereof need not be provided. Suffice it to say that tuner stages 33A and 33B include variable reactance devices, such as varactors. An antenna 31, or other signal receiving device, such as a transmission line, is coupled via a signal distributor 32 to tuner stages 33A and 33B. Signal distributor 32 is conventional and may include a signal splitter, such as a split transmission line or other conventional device for supplying the video signal received at antenna 31 to both tuner stages. Tuning signals are supplied to tuner stages 33A and 33B from channel selecting circuitry 40, these tuning signals comprising, for example, voltages of respective levels for controlling the varactors included in the tuner stages.

Channel selecting circuitry 40 is comprised of a clock generator 41, a counter 42, decoders 38A and 38B, selector switches $S_1 \ldots S_{10}$ and settable elements $VA_1 \ldots VA_{10}$ and $VB_1 \ldots VB_{10}$. Clock generator 41 is adapted to receive an energizing potential so as to generate successive, periodic clock pulses. The output of clock generator 41 is coupled to counter 42. The counter may comprise a multi-stage binary counter for counting the clock pulses supplied thereto, the count of counter 42 being incremented in response to each supplied clock pulse. The output of counter 42, that is, the multi-bit count thereof, is connected in parallel to decoder 38A. This multi-bit output also is coupled to a memory circuit 39, to be described, the latter having a multi-bit output connected in parallel to decoder 38B. The decoders may be of similar construction, each being adapted to decode the multi-bit count supplied thereto for providing an energizing signal at an individual one of its plural output terminals, the particular output terminal which is provided with the energizing signal being determined by the decoded count. As shown, decoder 38A includes output terminals $DA_1 \ldots DA_{10}$; and, similarly, decoder 38B includes output terminals $DB_1 \ldots DB_2$.

The outputs of decoder 38A are connected to transistor switches 37A, and the outputs of decoder 38B are connected to transistor switches 37B. More particularly, the base electrodes of transistor switches $TA_1 \ldots TA_{10}$, which constitute transistor switches 37A, are connected to output terminals $DA_1 \ldots DA_{10}$, respectively. Similarly, the base electrodes of transistor switches $TB_1 \ldots TB_{10}$, which constitute transistors switches 37B, are connected to decoder output terminals $DB_1 \ldots DB_{10}$, respectively. The collector-emitter circuits of transistor switches $TA_1 \ldots TA_{10}$ are connected in series with settable elements $VA_1 \ldots VA_{10}$, respectively, these settable elements being formed of potentiometers. A source of energizing potential 61 is connected in common to all of these potentiometers. In similar fashion, the collector-emitter circuits of transistor switches $TB_1 \ldots TB_{10}$ are connected in series with settable elements, or potentiometers, $VB_1 \ldots VB_{10}$. The source of energizing potential 61 is connected in common to all of these potentiometers. Each potentiometer includes an adjustable tap which is preset by the user such that, when current flows through the potentiometer, an output potential is provided at the tap thereof having a particular level which, when supplied to tuner stage 33A or tuner stage 33B establishes the proper reactance therein so as to tune the tuner stage to a corresponding channel. The output taps of potentiometers $VA_1 \ldots VA_{10}$ are connected via respective diodes to tuner stage 33A; and the output taps of potentiometers $VB_1 \ldots VB_{10}$ are connected via respective diodes to tuner stage 33B. Preferably, the setting of the output tap of potentiometer $VA_1$ is equal to the setting of the output tap of potentiometer $VB_1$ so that when these respective potentiometers are energized, that is, when current flows therethrough, the same potential level is supplied to tuner stages 33A and 33B from their respective output taps. As an example, potentiometers $VA_1$ and $VB_1$ may be set so as to supply potential levels to the respective tuner stages whereby these tuner stages are tuned to channel 2. The remaining potentiometers are suitably set in accordance with the particular channels to which the user desires to perceive. Hence, potentiometers $VA_2$ and $VB_2$ may be set so as to supply potential levels to tuner stages 33A and 33B whereby the tuning conditions of these tuners are tuned to channel 3. Potentiometers $VA_3$ and $VB_3$ (not shown) may be set so as to establish a tuning condition corresponding to channel 4. The remaining potentiometers are set appropriately, with the settings of respective potentiometers $VA_4 \ldots VA_{10}$ being equal to the settings of corresponding ones of respective potentiometers $VB_4 \ldots VB_{10}$.

The collector-emitter circuits of switching transistors $TA_1 \ldots TA_{10}$ additionally are connected in series with channel indicators $LA_1 \ldots LA_{10}$. Each of these channel indicators may comprise a visual indicating device, such as a lamp, a light emitting diode, or the like. A source of energizing potential 62 is connected in common with all of channel indicators $LA_1 \ldots LA_{10}$. Similarly, the collector-emitter circuits of transistor switches $TB_1 \ldots TB_{10}$ are connected in series with visual indicators $LB_1 \ldots LB_{10}$, respectively. These visual indicators may be identical to visual indicators $LA_1 \ldots LA_{10}$. A source of energizing potential 63 is connected in common to all of channel indicators $LB_1 \ldots LB_{10}$.

A plurality of parallel-connected circuits are coupled between source of energizing potential 61 and clock generator 41. Included in each of these parallel circuits is a respective selector switch $S_1 \ldots S_{10}$. More particularly, selector switch $S_1$ is connected between potentiometer $VA_1$ and clock generator 41, selector switch $S_2$ is connected between potentiometer $VA_2$ and the clock generator, and so on. It may be appreciated that when a selector switch is closed, the energizing potential provided by source 61 is coupled through the potentiometer connected to that closed selector switch, and thence to clock generator 41. The junction defined by potentiometer $VA_1$ and selector switch $S_1$ is connected to the collector-emitter circuit of transistor switch $TA_1$, the junction defined by potentiometer $VA_2$ and selector switch $S_2$ is connected to the collector-emitter circuit of transistor switch $TA_2, \ldots$ and the junction defined by potentiometer $VA_{10}$ and selector switch $S_{10}$ is connected to the collector-emitter circuit of transistor switch $TA_{10}$.

Memory circuit 39 is adapted to receive the multi-bit count provided by counter 42 and to supply this count to the respective inputs of decoder 38B. As the count changes, the count supplied by the memory circuit to decoder 38B likewise changes. Memory circuit 39 includes a latching input terminal coupled to the output of RECORD switch 21, the latter being included in VTR 20, for "latching", or locking the contents of the memory circuit to the count which had been supplied thereto immediately prior to the generation of the RECORD signal. As an example, memory circuit 39 may include a plurality of flip-flop circuits, such as the so-called R-S flip-flop circuits, each such flip-flop circuit being adapted to receive and store a respective bit included in the multi-bit count. The input to each such flip-flop circuit may be supplied via an AND gate, which AND gate is enabled in the absence of the RECORD signal. Thus, since these AND gates are enabled when the RECORD signal is not produced, the changing count provided by counter 42 is supplied through the AND gates and flip-flop circuits to decoder 38B. However, when the record signal is produced, the AND gates are disabled so as to prevent the contents of the flip-flop circuits from changing.

An inhibit transistor 64 has its base electrode connected to RECORD switch 21 and its collector-emitter circuit connected in series to source of energizing potential 63. It is recalled that source 63 supplies energizing potential to channel indicators $LB_1 \ldots LB_{10}$. When inhibit transistor 64 is conductive, the collector-emitter circuit thereof shunts the energizing current from source 63 so as to prevent any of channel indicators $LB_1 \ldots LB_{10}$ from being energized. However, when inhibit transistor 64 is non-conductive, energizing current can be supplied from source 63 to an appropriate one of channel indicators $LB_1 \ldots LB_{10}$, as will be described.

Switching circuit 36 is illustrated herein as a change-over switch having inputs A and B connected to tuning devices A and B, respectively. The output of change-over switch 36 is connected to television receiver 10 and is selectively engageable either with input A or with input B. A control input of change-over switch 36 is connected to RECORD switch 21. As will be described, in the absence of a RECORD signal, the output of change-over switch 36 is in engagement with input B. However, when the RECORD signal is supplied thereto, change-over switch 36 operates so as to connect its output with input A. Although depicted herein as an electromechanical switching device, it should be appreciated that change-over switch 36 may comprise an electronic switch, such as a transistor switch, a diode switch, or the like.

Figure 3:
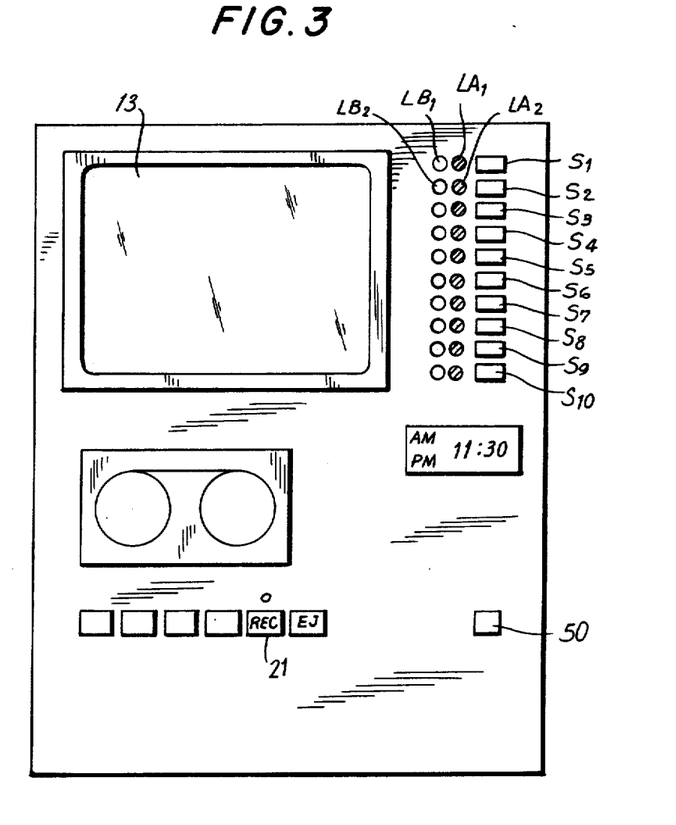
FIG. 3 is an illustrative view of the front panel of a cabinet housing a television receiver and a video recorder with which the present invention can be used.

FIG. 3 is a diagrammatic representation of the front panel of the housing in which television receiver 10 and VTR 20 are provided. Channel selector switches $S_1 \ldots S_{10}$, together with channel indicators $LA_1 \ldots LA_{10}$ and $LB_1 \ldots LB_{10}$ are illustrated. In addition, a power supply switch 50 is shown, this power supply switch, when actuated, being adapted to suitably energize the television and VTR processing circuits, as well as the various sources of energizing potential which are shown in FIG. 1.

The operation of the embodiment shown in FIG. 1 now will be described. Let it be assumed that power supply switch 50 had been actuated and that suitable energizing potentials are provided by the respective sources. Let it be further assumed that the tuner stages, VIF amplifiers and video detectors, as well as the signal processing circuits which are included in television receiver 10 and VTR 20 are operating. Initially, RECORD switch 21 is not actuated and, therefore, the RECORD signal is not produced.

Let it be assumed herein that the user wishes to observe and possibly record the program which is being broadcasted via the channel associated with potentiometer $VA_1$. For the purpose of the present discussion, it has been assumed that this channel is channel 2. Accordingly, channel selector switch $S_1$ is actuated, or closed. When channel selector switch $S_1$ is closed, a circuit is completed from source 61, through potentiometer $VA_1$ and switch $S_1$ to clock generator 41. Consequently, the clock generator is energized so as to supply successive clock pulse signals to counter 42. As the count of this counter is incremented in response to each clock pulse signal, the incremented count is supplied to decoder 38A and, via memory circuit 39, to decoder 38B. Both decoders decode the multi-bit counts supplied thereto. Depending upon the particular count which is supplied to these decoders, an energizing signal is produced at a corresponding output $DA_1 \ldots DA_{10}$ and at the analogous output $DB_1 \ldots DB_{10}$. Counter 42 is cyclical and, when the count thereof has been incremented so as to produce an energizing signal at outputs $DA_1$ and $DB_1$ of decoders 38A and 38B, respectively, transistor switches $TA_1$ and $TB_1$ are rendered conductive. It is seen that, when transistor switch $TA_1$ is conductive, the potential which had been supplied from source 61 through potentiometer $VA_1$ and closed switch $S_1$ to clock generator 41 now is shunted via the collector-emitter circuit of transistor switch $TA_1$. Thus, the energization of clock generator 41 is interrupted. As a consequence thereof, the operation of the clock generator terminates, and no further clock pulses are supplied to counter 42. Accordingly, the count then existing in this counter is maintained. This means that transistor switches $TA_1$ and $TB_1$ are maintained conductive, while the remaining transistor switches are maintained in their non-conductive states.

When transistor switches $TA_1$ and $TB_1$ conduct, currents flow through potentiometers $VA_1$ and $VB_1$, respectively. Thus, a potential level is provided at the output taps of these potentiometers, these potential levels being supplied to tuner stages 33A and 33B, respectively, so as to establish the corresponding tuning conditions thereof. In accordance with the example assumed herein, potentiometers $VA_1$ and $VB_1$ both are set so as to provide at their output taps potential levels which tune tuner stages 33A and 33B to channel 2. Thus, the broadcast frequency associated with channel 2 is received by these tuner stages, and the video information contained in such broadcast frequencies are demodulated and detected, the resultant video signals being provided at the outputs of video detectors 35A and 35B. Furthermore, since transistor switch $TA_1$ is conductive, current flows from source 62 through channel indicator $LA_1$ and the collector-emitter circuit of this conducting transistor. Channel indicator $LA_1$ thus is energized to provide an indication that tuner stage 33A is tuned to this channel. At this time, since RECORD switch 21 had not been actuated, the RECORD signal is not produced. In the absence of the RECORD signal, a relatively high voltage is supplied to the base electrode of inihibit transistor 64, thereby rendering this inhibit transistor conductive. Current thus flows from source 63 through the collector-emitter circuit of this inhibit transistor and, therefore, an energizer current is inhibited from flowing through channel indicator $LB_1$, even though transistor switch $TB_1$, which is connected to this channel indicator, is conductive.

Moreover, in the absence of the RECORD signal, change-over switch 36 operates so as to connect its output thereof to input B. Since tuner stage 33B is tuned to channel 2, by reason of the fact that current flows through transistor switch $TB_1$ and through potentiometer $VB_1$, and the setting of this potentiometer results in a potential level supplied to tuner stage 33B which effectively tunes this tuner stage to channel 2, it is seen that the video information which is contained in the broadcast frequency of channel 2 is supplied from tuning device B through change-over switch 36 to television receiver 10. Thus, prior to the actuation of VTR 20, the user can perceive the video information which is contained in the channel to which tuner stage 33B is tuned and, therefore, can ascertain whether this tuner stage exhibits a satisfactory tuning condition. Stated otherwise, although tuning device A also is tuned to channel 2, change-over switch 36 connects the output of tuning device B to the television receiver so that the tuning condition of tuning device B can be monitored. If necessary, the setting of potentiometer $VB_1$ can be adjusted so as to improve the tuning condition of tuning device B.

In the event that the user is dissatisfied with the program contained in channel 2, the channel to which tuning device B is tuned, or in the event that the tuning condition of tuner stage 33B cannot be adjusted satisfactorily, the user may select another channel to which the illustrated apparatus is tuned. This is attained by actuating a different one of selector switches $S_1 \ldots S_{10}$, such as, for example, by actuating selecting switch $S_2$. When this switch is actuated, a circuit is completed from source 61 through potentiometer $VA_2$ and closed selector switch $S_2$ to supply energizing potential to clock generator 41. Hence, clock generator 41 resumes its operation to supply additional clock pulses to counter 42, thereby incrementing the count of this counter. The incremented count is supplied to decoder 38A and, via memory circuit 39, to decoder 38B. When the count of counter 42 is decoded so as to produce energizing signals at outputs $DA_2$ and $DB_2$ of decoders 38A and 38B, respectively, transistor switches $TA_2$ and $TB_2$ are energized. It is recognized that, once the count of counter 42 changes from its previous count, the energizing signals previously provided at outputs $DA_1$ and $DB_1$ of decoders 38A and 38B terminate. Hence, at the time that transistor switches $TA_2$ and $TB_2$ are energized, all of the remaining transistor switches are non-conductive.

In the manner discussed above, when transistor switches $TA_2$ and $TB_2$ are rendered conductive, tuner stages 33A and 33B are tuned to the channels corresponding to the settings of potentiometers $VA_2$ and $VB_2$. Also, channel indicator $LA_2$ is energized. Since RECORD switch 21 had not yet been actuated, inhibit transistor 64 remains conductive so as to inhibit channel indicator $LB_2$ from being energized. The video information contained in the channel to which tuner stage 33B now is tuned, that is, the channel corresponding to the setting of potentiometer $VB_2$, appears at the output of tuning device B and is supplied via change-over switch 36 to television receiver 10. It is seen that this video information also is supplied to VTR 20; but, in the absence of the actuation of RECORD switch 21, this video information is not recorded. Also, since tuner stage 33A is tuned to the channel associated with the setting of potentiometer $VA_2$ (which channel is assumed to be equal to the channel to which tuner stage 33B is tuned because of the equal settings of potentiometers $VA_2$ and $VB_2$), the video information contained in this channel appears at the output of tuning device A.

Let it now be assumed that the user desires to record the program which is contained in the channel to which tuner stage 33B is tuned. Accordingly, RECORD switch 21 is actuated (e.g. closed) to supply the RECORD signal to memory circuit 39 and to inhibit transistor 64. The memory circuit responds to this RECORD signal to "latch", or lock, the contents thereof to the multi-bit count which had been supplied thereto by counter 42 immediately prior to the actuation of RECORD switch 21. Thus, memory circuit 39 stores the multi-bit count which represents the channel to which potentiometer $VB_2$ is set. In the example assumed hereinabove, this channel is equal to channel 3. Thus, the multi-bit count which represents channel 3 is stored in memory circuit 39. Decoder 38B decodes this count to provide the energizing signal at its output $DB_2$, thereby maintaining transistor switch $TB_2$ conductive. Consequently, current continues to flow through potentiometer $VB_2$, and the potential level at the output tap thereof is supplied to tuner stage 33B to maintain this tuner stage tuned to channel 3. The video signals contained in the channel 3 program are supplied from video detector 35B at the output of tuning device B to VTR 20 for recording. Furthermore, the RECORD signal is assumed to exhibit a relatively low level which is insufficient to maintain inhibit transistor 64 in its conductive state. Consequently, the inhibit function performed by this inhibit transistor terminates. Current now flows from source 63 through channel indicator $LB_2$ and the collector-emitter circuit of conducting transistor switch $TB_2$. Accordingly, channel indicator $LB_2$ is energized to indicate that tuner stage 33B is tuned to channel 3, that is, that this tuner stage is tuned to the channel determined by the setting of potentiometer $VB_2$. Of course, since only output $DB_2$ of decoder 38B is provided with an energizing signal, none of transistor switches $TB_1$, $TB_3 \ldots TB_{10}$ is conductive. Hence, only channel indicator $LB_2$ is energized to apprise the user of the particular channel to which tuner stage 33B is tuned, and thus the video program which is being recorded by VTR 20.

When the RECORD signal is produced in response to the actuation of RECORD switch 21, change-over switch 36 is operated so as to connect its output to input A thereof. Thus, whereas, prior to the actuation of RECORD switch 21, television receiver 10 displayed the video picture which had been derived from tuning device B, the television receiver now displays the video picture which is derived from tuning device A. More particularly, tuner stage 33A is tuned to the particular channel determined by channel selecting circuitry 40 and transistor switches 37A, and the video signals which are contained in this channel are derived from video detector 35A at the output of tuning device A. It is recalled that, prior to the actuation of RECORD switch 21, selector switch $S_2$ had been closed to energize clock generator 41, whereby counter 42 had been incremented to a count corresponding to channel 3, the channel to which potentiometer $VA_2$ is set. When this count had been attained, decoder 38A had decoded it to provide an energizing signal at its output $DA_2$, thereby rendering transistor switch $TA_2$ conductive. This, in turn, had shunted the energizing potential away from clock generator 41, thereby interrupting the operation of the clock generator and thus preventing counter 42 from being incremented further. Transistor switch $TA_2$ thus had maintained its conductivity, resulting in a current flow through potentiometer $DA_2$. This, in turn, supplied a potential level from the output tap of this potentiometer to tuner stage 33A, thereby tuning this tuner stage to the channel determined by the potential level supplied thereto. Now, when RECORD switch 21 is actuated, there is no change in the count of counter 42, the energizing signal provided at output $DA_2$ of decoder 38A, the conductivity of transistor switch $TA_2$ or the current flow through potentiometer $DA_2$. Hence, even after RECORD switch 21 is closed, tuner stage 33A remains tuned to channel 3, that is, the tuner stage remains tuned to the channel determined by the potential level supplied thereto from the output tap of potentiometer $VA_2$. Accordingly, when change-over switch 36 is changed over in response to the RECORD signal supplied thereto so as to connect its output to its input A, television receiver 10 displays the video picture which is broadcasted over channel 3. It is recalled that the settings of potentiometers $VA_1 \ldots VA_{10}$ had been assumed to be equal to the settings of potentiometers $VB_1 \ldots VB_{10}$, respectively. Accordingly, the change over of switch 36 will not vary the program information which is displayed by television receiver 10.

Although one channel (e.g. channel 3) of video information is being recorded by VTR 20, the user may, if desired, monitor any other channel. This is attained by the actuation of any of selector switches $S_1 \ldots S_{10}$. It should b realized that, if the selector switch which is associated with the very channel to which tuner stage 33A is tuned is actuated, there will be no change in the count of counter 42 and, thus, no change in the tuning condition of tuner stage 33A. This is because the conductivity of transistor switch $TA_2$ prevents the energizing potential which otherwise would be supplied from source 61 to clock generator 41 by selector switch $S_2$ from being supplied thereto.

If a different selector switch, such as selector switch $S_{10}$, is actuated, the closing of this switch establishes a conducting path from source 61 through potentiometer $VA_{10}$ and through switch $S_{10}$ to clock generator 41, thereby energizing the clock generator. As clock generator 41 operates, the successive clock pulses supplied therefrom to counter 42 increment the count of this counter. As counter 42 is incremented, decoder 38A decodes each count to provide an energizing signal at a corresponding output thereof. When the energizing signal which had been provided at output $DA_2$ terminates, transistor switch $TA_2$ is rendered non-conductive, thereby extinguishing channel indicator $LA_2$. Eventually, the count of counter 42 is incremented to a count which is decoded by decoder 38A to provide an energizing potential at output $DA_{10}$. This renders transistor switch $TA_{10}$ conductive so as to interrupt the energizing potential which had been applied to clock generator 41. Consequently, further operation of the clock generator is interrupted, and the count of counter 42 is maintained. Additionally, since transistor switch $TA_{10}$ is conductive, current flows through potentiometer $VA_{10}$ so as to supply tuner stage 33A with a potential level determined by the setting of this potentiometer. Also, channel indicator $LA_{10}$ is energized. Thus, tuner stage 33A is tuned to the channel determined by the setting of potentiometer $VA_{10}$, and channel indicator $LA_{10}$ is energized to indicate the particular channel to which the tuner stage is tuned. The video signals contained in this channel are derived at the output of tuning device A and are supplied from input A of change-over switch 36 to television receiver 10. The user thus may view the video picture which is contained in the channel to which tuner stage 33A now is tuned. It is recognized that this channel differs from the channel to which tuner stage 33B is tuned. Hence, although VTR 20 records the video signals which are contained in one channel, television receiver 10 displays a video picture which is contained in a different channel.

When the video recording operation is completed, RECORD switch 21 is deactuated, or opened, as by the manual operation by the user. This terminates the RECORD signal which had been supplied to memory circuit 39, inhibit transistor 64 and change-over switch 36. Accordingly, memory circuit 39 no longer is latched, or locked, and the contents thereof now can change so as to correspond to the actual count supplied thereto by counter 42. The count stored in the memory circuit now changes so as to be equal to the count which resulted in energizing transistor switch $TA_{10}$. This count is supplied from memory circuit 39 to decoder 38B, resulting in an energizing signal provided at output $DB_{10}$. Consequently, transistor switch $TB_{10}$ is rendered conductive so that current flows through potentiometer $VB_{10}$. The potential level provided at the output tap of this potentiometer is supplied to tuner stage 33B, thereby tuning this tuner stage to the corresponding channel. It is appreciated that now tuner stages 33A and 33B both are tuned to the same channel.

When the RECORD signal is removed from inhibit transistor 64, this transistor becomes conductive so as to prevent any of channel indicators $LB_1 \ldots LB_{10}$ from being energized. Thus, when transistor switch $TB_{10}$ is conductive, current cannot flow from source 63 through channel indicator $LB_{10}$ because of the current shunting effect of inhibit transistor 64.

The RECORD signal supplied to change-over switch 36 changes the condition of this switch so as to connect its output to input B. Therefore, television receiver 10 now is supplied with the video signals which are derived from tuning device B, this tuning device being tuned to the channel established by the setting of potentiometer $VB_{10}$. The television receiver thus monitors the tuning condition of tuner stage 33B in the absence of the actuation of the record operation of VTR 20.

From the foregoing, it is seen that, prior to the record operation of VTR 20, the viewer can monitor the tuning condition of tuning device B. If the tuning condition is less than satisfactory, adjustments can be made, such as by modifying the setting of the potentiometer which establishes the channel to which tuner stage 33B is tuned. If the user is satisfied with the tuning condition, RECORD switch 21 is actuated so that the output of tuning device B is recorded. In response to the actuation of the RECORD switch, memory circuit 39 is latched so as to fixedly store the count produced by counter 42 and corresponding to the channel to which tuner stage 33B is tuned. The stored count remains unchanged even if counter 42 subsequently is varied. While VTR 20 records the video program contained in the selected channel, the user can operate any one of selector switches $S_1 \ldots S_{10}$ so as to select a different channel to which tuner stage 33A is tuned. Hence, television receiver 10 can display the video picture derived from any desired channel, independently of the particular channel program which is being recorded by VTR 20. At the completion of the recording operation, tuner stage 33B is tuned to the channel which had been selected by the actuation of the particular selector switch $S_1 \ldots S_{10}$; that is, tuner stage 33B is tuned to the same channel to which tuner stage 33A is tuned. This is because, when VTR 20 is deactuated, the RECORD signal is terminated so as to enable memory circuit 39 to store the instantaneous count supplied thereto by counter 42, this count being supplied, in turn, from the memory circuit to decoder 38B.

During the recording of the video signals by VTR 20, the viewer may wish to monitor the tuning condition of tuning device B. However, in the embodiment shown in FIG. 1, since the RECORD signal maintains change-over switch 36 in the condition such that the video signals derived from tuning device A only are supplied to television receiver 10, this monitoring cannot be achieved during the recording operation. That is, even if tuner stage 33A is tuned to the very same channel to which tuner stage 33B is tuned, change-over switch 36 maintains the output of tuning device A connected to television receiver 10. The output of tuning device B cannot be supplied to the television receiver during the recording operation. This situation is avoided by the embodiment illustrated in FIG. 2. The apparatus illustrated in FIG. 2 differs from that described previously with respect to FIG. 1 by the addition of a switching circuit 65 and a coincidence detector 66. The output of record switch 31 is connected to inhibit transistor 64 and the memory circuit 39, as before, and is connected to the control input of change-over switch 36 by switching circuit 65. Switching circuit 65 has a control input connected to the output of coincidence detector 66 and is adapted to receive a control signal whereby the switching circuit effectively is "closed" when coincidence detector 66 does not detect a coincidence between the signals supplied to its respective sets of inputs. When such a coincidence is detected, switching circuit 65 is "opened". Coincidence detector 66 includes one set of inputs connected to the outputs of memory circuit 39 to receive the multi-bit count which is supplied to decoder 38B by the memory circuit, and a second set of inputs connected to receive the multi-bit count which is supplied by counter 42 to decoder 38A. As one example thereof, coincidence detector 66 may comprise a plurality of exclusive-OR gates, each such exclusive-OR gate having an input connected to receive one of the bits included in the count supplied to decoder 38B and another input connected to receive the corresponding bit included in the count which is supplied to decoder 38A. The outputs of all of these exclusive-OR gates are supplied to an OR gate whose output is, in turn, connected to the control input of switching circuit 65. In accordance with the conventional operation of exclusive-OR gates, if the multi-bit count supplied to coincidence detector 66 by memory circuit 39 is identical to, or coincides with, the multi-bit count supplied to decoder 38A, each exclusive-OR gate produces a binary "0". Hence, the output of the OR gate connected to these exclusive-OR gates likewise is a binary "0". When this binary "0" is supplied to switching circuit 65, the switching circuit is "opened".

In operation, prior to a recording operation, the operation of a particular selector switch $S_1 \ldots S_N$ (shown in FIG. 2) results in a count supplied by counter 42 to decoder 38A and also through memory circuit 39 to decoder 38B. Hence, the counts supplied to the respective sets of inputs of coincidence detector 66 by counter 42 and by memory circuit 39 are in coincidence with each other. Hence, a binary "0" is supplied from the coincidence detector to switching circuit 65, thereby opening this switching circuit. Also, in the absence of a recording operation, the RECORD signal is not produced by RECORD switch 21. Therefore, change-over switch 36 is in its operative state to connect the output of tuning device B to television receiver 10. The user thus may monitor the tuning condition of tuning device B, prior to the recording operation.

Figure 2:
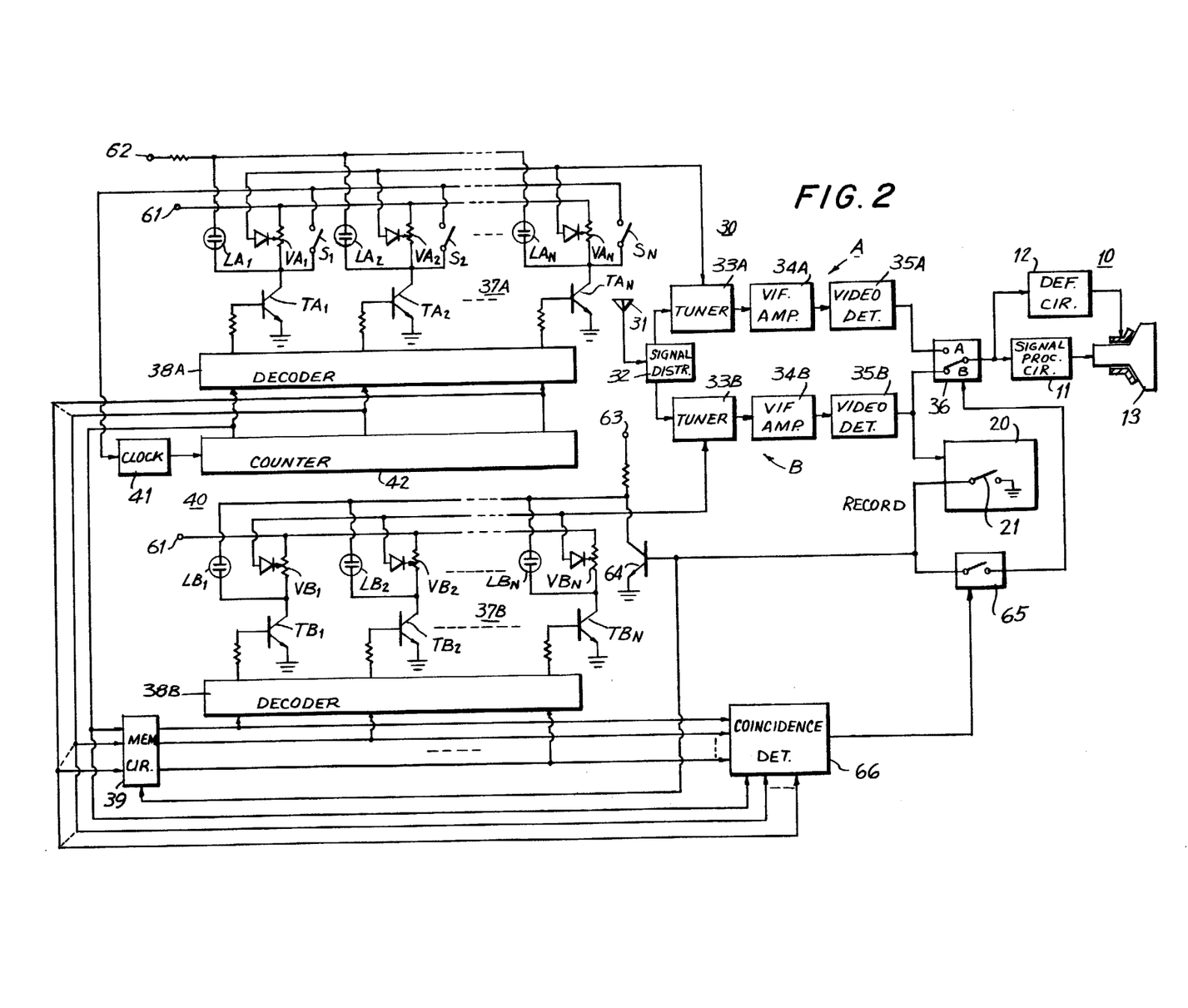
FIG. 2 is a partial block, partial schematic diagram of another embodiment of the present invention.

If the user wishes to record the video signals which are being monitored, RECORD switch 21 is closed. As described previously, this results in latching memory circuit 39 to store the count which is supplied thereto by counter 42. Thus, tuner stage 33B remains tuned to the very same channel to which it had been tuned immediately prior to the actuation of the RECORD switch. If no other selector switch $S_1 \ldots S_N$ is actuated, it is appreciated that the count of counter 42 is not changed. Hence, coincidence detector 66 detects that the count supplied thereto by memory circuit 39 and the count supplied thereto by counter 42 coincide. Accordingly, the coincidence detector supplies a binary "0" to switching circuit 65, thereby maintaining this switching circuit opened. The RECORD signal thus cannot be supplied to change-over switch 36. Even though the recording operation is being performed, television receiver 10 is supplied with video signals which are derived from the output of tuning device B, and not from tuning device A. The user may, therefore, monitor the tuning condition of tuning device B even during the recording operation.

If the user wishes to view a program which is different from the program being recorded by VTR 20, an appropriate selector switch $S_1 \ldots S_N$ is actuated, as discussed previously. Although this changes the count of counter 42, the latched contents of memory circuit 39 are not varied. Thus, tuner stage 33B remains tuned to the channel which had been selected previously and which not is being recorded by VTR 20. When the count of counter 42 changes in response to the actuation of a desired selector switch $S_1 \ldots S_N$, it is appreciated that coincidence detector 66 now is supplied with respective counts which differ from each other. Thus, the coincidence detector detects the non-coincidence of these counts, thereby supplying a binary "1" to switching circuit 65. As a result thereof, the switching circuit is closed so as to supply the RECORD signal to change-over switch 36. The change-over switch operates in the manner described previously so as to connect the output of tuning device A to television receiver 10.

Thus, it is seen that when the user wishes to view a television program which differs from the program being recorded by VTR 20, tuner stage 33A is tuned to the desired channel, and the output of this tuner stage is supplied via VIF amplifier 34A and video detector 35A, through change-over switch 36 to television receiver 10; while tuner stage 33B remains tuned to the channel associated with the "latched" count stored in memory circuit 39. If the user now wishes to monitor the tuning condition of tuning device B, the selector switch which is associated with the tuning condition of tuner stage 33B is actuated. From FIG. 3, it is seen that the proper selector switch is readily identified by reason of the energization of the one channel indicator $LB_1 \ldots LB_N$ which indicates the channel to which tuner stage 33B is tuned. When the appropriate channel selector switch is actuated, the count of counter 42 is incremented so as to be equal to the count stored in memory circuit 39. Thus, coincidence detector 66 is provided with coinciding counts, thereby applying a binary "0" to switching circuit 65. This, in turn, opens the switching circuit so as to remove the RECORD signal from change-over switch 36. The change-over switch connects the output of tuning device B to television receiver 10, thereby enabling the user to observe the tuning condition of tuner stage 33B. Since RECORD switch 21 remains actuated, the RECORD signal still is supplied to memory circuit 39 and to inhibit transistor 64. Accordingly, the contents of memory circuit 39 remain latched, and inhibit transistor 64 remains non-conductive. The appropriate channel indicator $LB_1 \ldots LB_N$ remains energized, and the count stored in memory circuit 39 is not changed even if another selector switch $S_1 \ldots S_N$ is actuated.

Therefore, in the embodiment shown in FIG. 2, the user may monitor the quality of the video signals which are being recorded by VTR 20 during the recording operation. This enables the viewer to ascertain whether the tuning condition of tuning device B is satisfactory. Of course, in the embodiment of FIG. 2, the user may, if desired, view the program contained in any other channel, even while VTR 20 is in its recording mode.

While the present invention has been particularly shown and described with reference to certain preferred embodiments thereof, it will be readily apparent to those of ordinary skill in the art that various changes and modifications in form and details may be made without departing from the spirit and scope of the invention. For example, the RECORD signal which is supplied to change-over switch 36, memory circuit 39 and inhibit transistor 64 need not be produced directly from a RECORD switch, such as switch 21 described above. Rather, suitable control circuitry provided in VTR 20 may be used to produce this RECORD signal when a recording operation is carried out. Furthermore, and as mentioned previously, this invention need not be limited solely to the environment of a television receiver and a video recorder. It is contemplated that this invention finds ready application in other types of signal receivers, such as audio signal receivers, and other types of signal recorders, such as audio signal recorders. It is, therefore, intended that the appended claims be interpreted as including these as well as other such changes and modifications.

What is claimed is:

1. Channel selecting apparatus for use with a signal receiver coupled to a first tuning means and a signal recorder coupled to a second tuning means, said channel selecting apparatus being operable to tune said first and second tuning means to preselected channels for receiving information transmitted via selected broadcast frequencies, and comprising:

selectively operable channel selecting means common to said first and second tuning means for generating and supplying channel selector signals to said first and second tuning means to determine the tuning condition of both said tuning means;

locking means operative in response to the actuation of said signal recorder to lock said second tuning means to the tuning condition determined by the channel selector signal generated by said channel selecting means immediately prior to said actuation of said signal recorder regardless of the subsequent generation of different channel selector signals by said channel selecting means, said locking means being operative in response to the non-actuation of said signal recorder to permit said channel selector signals generated by said channel selecting means to control the tuning condition of both said first and second tuning means together; and switch means having first and second inputs coupled to said first and second tuning means, respectively, to receive the information contained in the channels to which said first and second tuning means are tuned, and an output coupled to said signal receiver, said switch means being operative when said signal recorder is not actuated to connect said output thereof to said second input and being operative when said signal recorder is actuated to connect said output thereof to said first input; whereby the information transmitted via the broadcast frequency received by said second tuning means is supplied to said signal receiver when said signal recorder is not actuated and the information transmitted via the broadcast frequency received by said first tuning means is supplied to said signal receiver when said signal recorder is actuated.

2. The apparatus of claim 1 wherein each of said first and second tuning means comprises an electrically tunable tuning stage; a plurality of settable tuning elements, each for supplying a respective electrical tuning signal to said tuning stage; and energizing means responsive to channel selector signals supplied thereto for energizing the settable element corresponding to the supplied channel selector signal.

3. The apparatus of claim 2 wherein said locking means comprises memory means for receiving each channel selector signal and supplying same to said energizing means included in said second tuning means, said memory means being responsive to the actuation of said signal recorder for storing the channel selector signal received immediately prior to said actuation and thereafter being non-responsive to further channel selector signals received during the duration that said signal recorder remains actuated.

4. The apparatus of claim 3 wherein said channel selecting means comprises a plurality of selector switches; clock signal generating means responsive to the actuation of a selector switch for generating clock signals; cyclical counting means responsive to each clock signal to increment the count thereof, each of said selector switches being associated with a respective count of said counting means; and means for detecting when the count of said counting means is equal to the count associated with the actuated selector switch to interrupt the operation of said clock generating means; whereby the count of said counting means is maintained until another selector switch is actuated.

5. The apparatus of claim 4 wherein the count of said counting means constitutes the respective channel selector signals and wherein said memory means has an input circuit connected to receive said count of said counting means and an output circuit connected to said energizing means included in said second tuning means.

6. The apparatus of claim 5 further comprising coincidence means for detecting when said count of the counting means coincides with the count supplied to said energizing means included in said second tuning means by said memory means; and control means coupled to said coincidence means for controlling said switch means to connect said output thereof to said second input when said count of the counting means is detected as coinciding with the count supplied to said energizing means included in said second tuning means and for controlling said switch means to connect said output thereof to said first input when said count of the counting means is detected as not coinciding with the count supplied to said energizing means included in said second tuning means; whereby the information transmitted by the broadcast frequency received by said second tuning means is supplied to said signal receiver when said first and second tuning means are tuned to the same channel even when said signal recorder is actuated.

7. The apparatus of claim 5 further comprising a record switch for producing a RECORD signal when said signal recorder is actuated; and wherein said memory means comprises a control input connected to receive said RECORD signal to store the count of said counting means at the time that said RECORD signal is received; and wherein said switch means normally connects said output thereof to said second input, said switch means includes a control input connected to receive said RECORD signal to connect said output thereof to said first input.

8. The apparatus of claim 7 wherein each of the energizing means included in said tuning means comprises a decoder for receiving a count, said decoder having a plurality of output terminals and operative to provide an energizing signal at the one output terminal thereof corresponding to the received count; and a plurality of transistor switch means, each connected to a respective output terminal of said decoder for receiving an energizing signal provided thereat, and each transistor switch means being connected to a respective settable element to energize the latter when said transistor switch means receives an energizing signal, whereby the energized settable element supplies an electrical tuning signal to said tuning stage.

9. The apparatus of claim 8 further comprising a respective channel indicator coupled to each of said transistor switch means included in the energizing means in each of said tuning means, said channel indicator being energized by the transistor switch means coupled thereto when said transistor switch means receives an energizing signal, thereby indicating the particular channel to which the respective tuning means is tuned.

10. The apparatus of claim 9 further comprising inhibit means coupled to the channel indicators included in said second tuning means for inhibiting said last-mentioned channel indicators from being energized unless said RECORD signal is produced.

11. The apparatus of claim 8 wherein each of said selector switches is connected in a parallel circuit between a source of energizing potential and said clock signal generating means to supply, when actuated, said energizing potential to said clock signal generating means; and wherein each of said transistor switch means included in the energizing means in said first tuning means is connected in shunt relation with a respective one of said parallel circuits to interrupt the supply of energizing potential to said clock pulse generating means when said transistor switch means receives an energizing signal.

12. The apparatus of claim 1 wherein said signal receiver is a television receiver including display means for displaying a television picture derived from the broadcast frequency supplied thereto by said switch means; and wherein said signal recorder comprises a video recorder for recording video signals derived from the broadcast frequency supplied thereto by said second tuning means.

* * * * *